United States Patent
Jiang et al.

(10) Patent No.: US 11,454,759 B2
(45) Date of Patent: Sep. 27, 2022

(54) HIGH-THROUGHPUT MANUFACTURING OF PHOTONIC INTEGRATED CIRCUIT (PIC) WAVEGUIDES USING MULTIPLE EXPOSURES

(71) Applicant: ARIZONA BOARD OF REGENTS ON BEHALF OF THE UNIVERSITY OF ARIZONA, Tucson, AZ (US)

(72) Inventors: Linan Jiang, Tucson, AZ (US); Stanley K. H. Pau, Tucson, AZ (US); Robert A. Norwood, Tucson, AZ (US); Thomas L. Koch, Tucson, AZ (US)

(73) Assignee: ARIZONA BOARD OF REGENTS ON BEHALF OF THE UNIVERSITY OF ARIZONA, Tucson, AZ (US)

( * ) Notice: Subject to any disclaimer, the term of this patent is extended or adjusted under 35 U.S.C. 154(b) by 207 days.

(21) Appl. No.: 16/641,297

(22) PCT Filed: Aug. 22, 2018

(86) PCT No.: PCT/US2018/047455
§ 371 (c)(1),
(2) Date: Feb. 24, 2020

(87) PCT Pub. No.: WO2019/040582
PCT Pub. Date: Feb. 28, 2019

(65) Prior Publication Data
US 2020/0379175 A1 Dec. 3, 2020

Related U.S. Application Data

(60) Provisional application No. 62/550,132, filed on Aug. 25, 2017.

(51) Int. Cl.
*B29D 11/00* (2006.01)
*G02B 6/138* (2006.01)

(52) U.S. Cl.
CPC ........ *G02B 6/138* (2013.01); *B29D 11/00682* (2013.01)

(58) Field of Classification Search
CPC ..................... B29D 11/00682; G02B 6/138
See application file for complete search history.

(56) References Cited

U.S. PATENT DOCUMENTS 6,438,307 B1 * 8/2002 Kaneko ............... G02B 6/13
                                                    385/129
6,503,421 B1    1/2003 Wang
(Continued)

FOREIGN PATENT DOCUMENTS

| WO | 2007/128041 A1 | 11/2007 |
| WO | 2014/186549 A1 | 11/2014 |
| WO | 2017/059445 A1 | 4/2017 |

*Primary Examiner* — Mathieu D Vargot
(74) *Attorney, Agent, or Firm* — Stuart H. Mayer; Mayer & Williams PC (57) ABSTRACT

In accordance with a method of forming a waveguide in a polymer film disposed on a substrate, a plurality of regions on a polymer film are selectively exposed to a first dosage of radiation. The polymer film is formed from a material having a refractive index that decreases by exposure to the radiation and subsequent heating. At least one region of the polymer film that was not previously exposed to the radiation is selectively exposing to a second dosage of radiation. The second dosage of radiation is less than the first dosage of radiation. The polymer film is heated to complete curing of the polymer film.

10 Claims, 10 Drawing Sheets

(56) References Cited

U.S. PATENT DOCUMENTS

| | | |
|---|---|---|
| 6,907,176 B2 | 6/2005 | Gardner |
| 2002/0142096 A1 | 10/2002 | Connell |
| 2017/0038678 A1 | 2/2017 | Hirayama et al. |

* cited by examiner

HIGH-THROUGHPUT MANUFACTURING OF PHOTONIC INTEGRATED CIRCUIT (PIC) WAVEGUIDES USING MULTIPLE EXPOSURES

GOVERNMENT FUNDING

This invention was made with government support under Grant No. FA8650-15-2-5220, awarded by Air Force Material Command. The government has certain rights in the invention.

BACKGROUND

An important problem in optical packaging involves the optical interconnection of planar-integrated photonic integrated circuits (chip-chip connections) and the connection of such circuits to the external world. Photonic integrated circuits (PICs) refer to waveguide-based photonic components, including optical integrated devices such as lasers, optical amplifiers, switches, filters, modulators, splitters, phase shifters, variable attenuators, detectors, and the like. PICs can also include integration with semiconductor devices such as CMOS electronic devices. PICs allow systems with high complexity and multiple functions to be integrated on a single substrate to thereby allow the generation, detection, propagation and modulation of both optical and electrical signals. PICs may employ a variety of different material systems, including silicon, silicon nitride, polymer, silicon dioxide, ion-exchange glass, lithium niobate, InP, GaAs, and graphene, and optical interconnection processes should be compatible with these material systems. In some cases polymer waveguides are used to interconnect optical devices such as PICs to other PICs and Optical Printed Circuit Boards (OPCB).

SUMMARY

In one aspect, a method is provided of forming a waveguide in a polymer film disposed on a substrate. In accordance with the method, a plurality of regions on a polymer film are selectively exposed to a first dosage of radiation. The polymer film is formed from a material having a refractive index that decreases by exposure to the radiation and subsequent heating. At least one region of the polymer film that was not previously exposed to the radiation is selectively exposing to a second dosage of radiation. The second dosage of radiation is less than the first dosage of radiation. The polymer film is heated to complete curing of the polymer film.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. Furthermore, the claimed subject matter is not limited to implementations that solve any or all disadvantages noted in any part of this disclosure. These and various other features will be apparent from a reading of the following Detailed Description and a review of the associated drawings.

DETAILED DESCRIPTION

Figure 1:
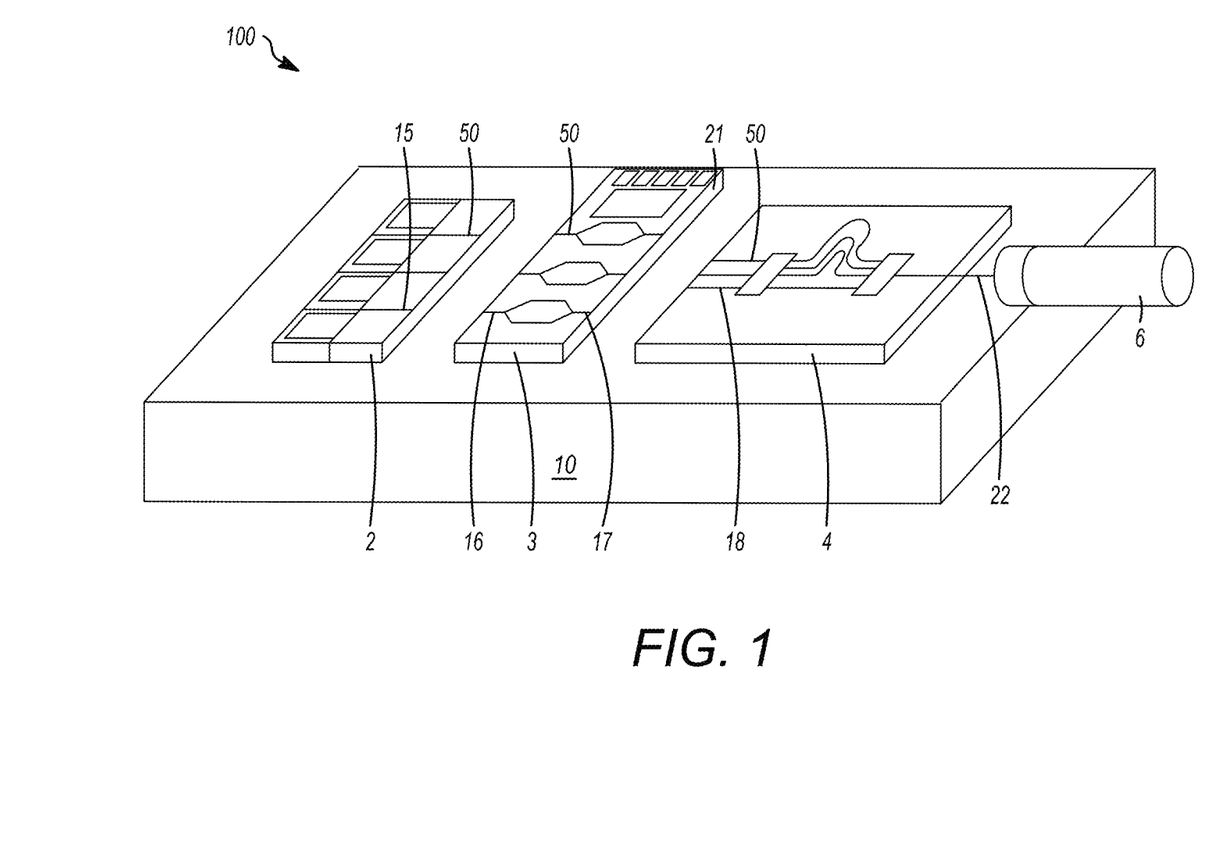
FIG. 1 shows a perspective view of one example of a Photonic Integrated Circuit (PIC) to which the techniques described herein may be applied.

Described herein is a method of fabricating polymer waveguides in a polymer film. The polymer waveguides may be waveguides that can be used for a wide variety of different purposes. For instance, the polymer waveguides may be used to form optical interconnections between the chips of a photonic integrated circuit (PIC), an example of which is shown in FIG. 1.

PIC 100 includes multiple photonic systems that are integrated on different substrates ("chips") 2, 3 and 4 and which contain lateral single-mode waveguides 50. The waveguides 50 positioned on different chips are to be interconnected and/or are to be connected to input/output optical fiber 6. The various components 2, 3 and 4 are mounted on a substrate 10 that serves as a component carrier. The components of the PIC 100 are to be interconnected with optical interconnect structures at connecting points 15, 16, 17 and 18. For instance, one optical interconnect structure may interconnect points 15 and 16 and another optical interconnect structure may interconnect points 17 and 18.

Fabrication of a waveguide that may be used for an optical interconnect structure in PIC 100 or for any other purpose will be described with reference to FIGS. 2(a)-2(d), which illustrate a process by which a polymer waveguide is defined by exposure of a dry film polymer resist using ultraviolet (UV) or other radiation and by subsequent baking. The polymer material is chosen so that, after thermal treatment, the region of the polymer that is exposed to the UV radiation has a lower refractive index than the region that is not exposed to the UV radiation.

Figure 2A:
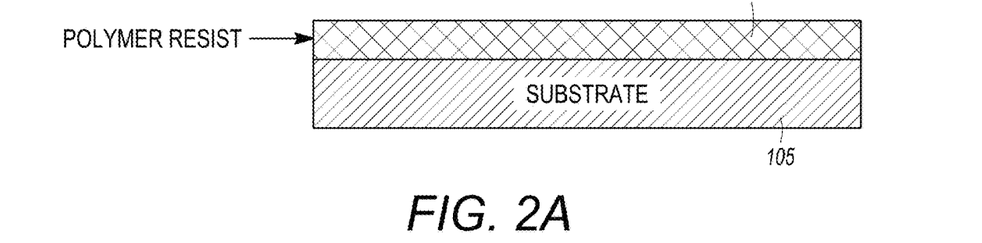
FIGS. 2(a)-2(d) illustrate a process for fabricating a polymer waveguide.
Figure 2B:
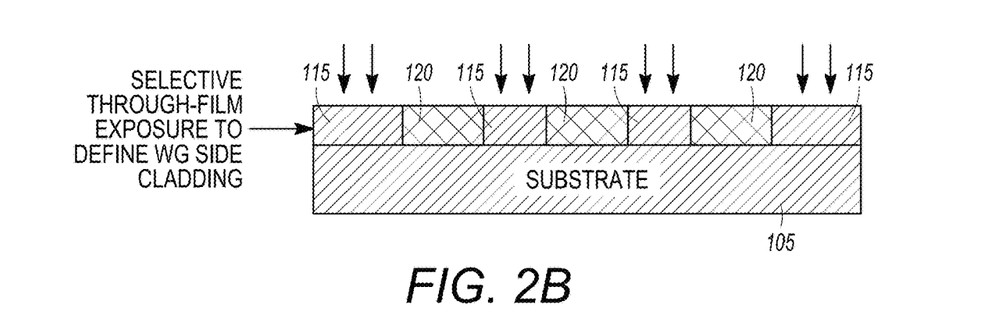

In FIG. 2(a) a layer 110 of a photosensitive polymer such as a tape or film is located on a substrate 105. In FIG. 2(b) the polymer layer 110 is selectively exposed to e.g., ultraviolet (UV) radiation, to define the waveguide. The patterning may be accomplished using a mask or a maskless lithograph process. In one embodiment, the 15/764,064 may be used. In particular, only the portions of the polymer layer 110 that are to form the cladding are selective exposed. After thermal treatment, the exposed portions 115 will have a lower refractive index than the unexposed portions of the polymer. The unexposed portions 120 of polymer layer 110 therefore form the waveguide core.

Figure 2C:
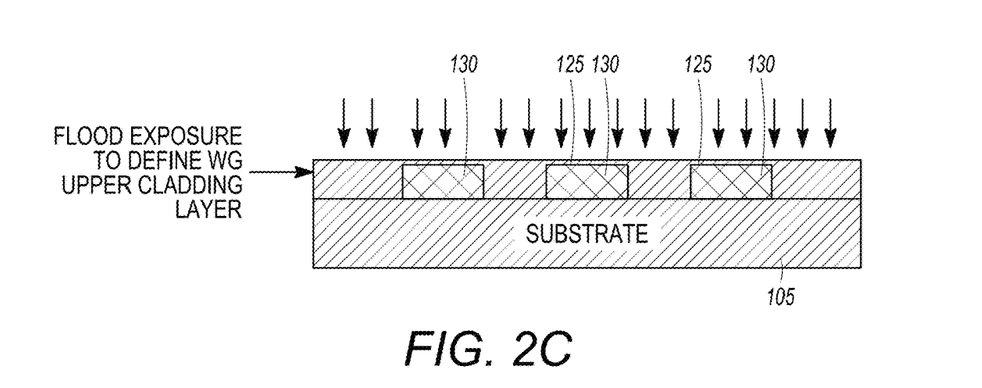

Next, as shown in FIG. 2(c), the upper cladding 125 is formed by a UV flood exposure in which the entire surface of the polymer layer 110 is exposed to the UV radiation. This second exposure creates a thinner and more confined waveguide core 130. In some embodiments this flood exposure may sufficiently reduce the thickness of the waveguide core 130 so that the waveguide functions as a single mode waveguide at a suitable optical wavelength. The flood exposure may be performed without a mask or using a maskless lithography process to write over the entire region with a uniform exposure.

Figure 2D:
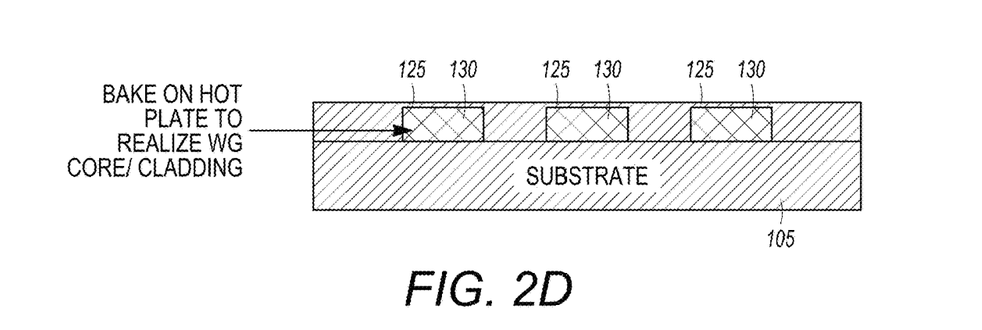

Once the exposure steps have been completed, the polymer undergoes a thermal treatment step (e.g., hotplate or oven baking and/or infrared radiation) in FIG. 2(d) to fix the refractive index profile.

Figure 3A:
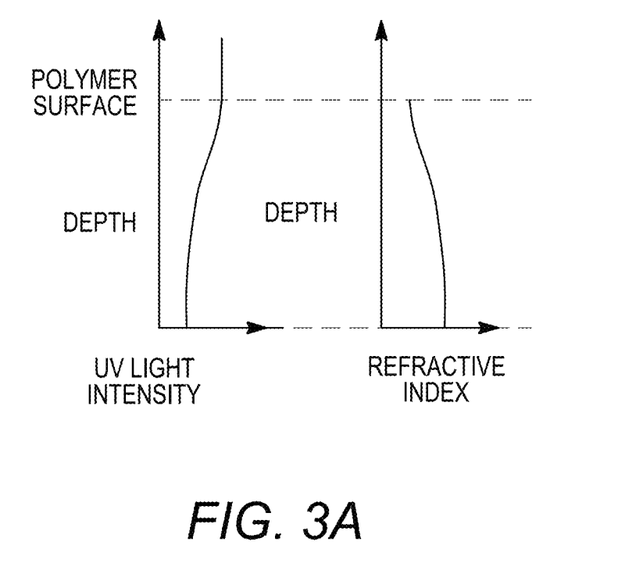
FIG. 3(a) illustrates the relationship between the intensity of the UV light and the distance or depth into the polymer film and the relationship between the refractive index and the depth into the polymer polymer film.
Figure 3B:
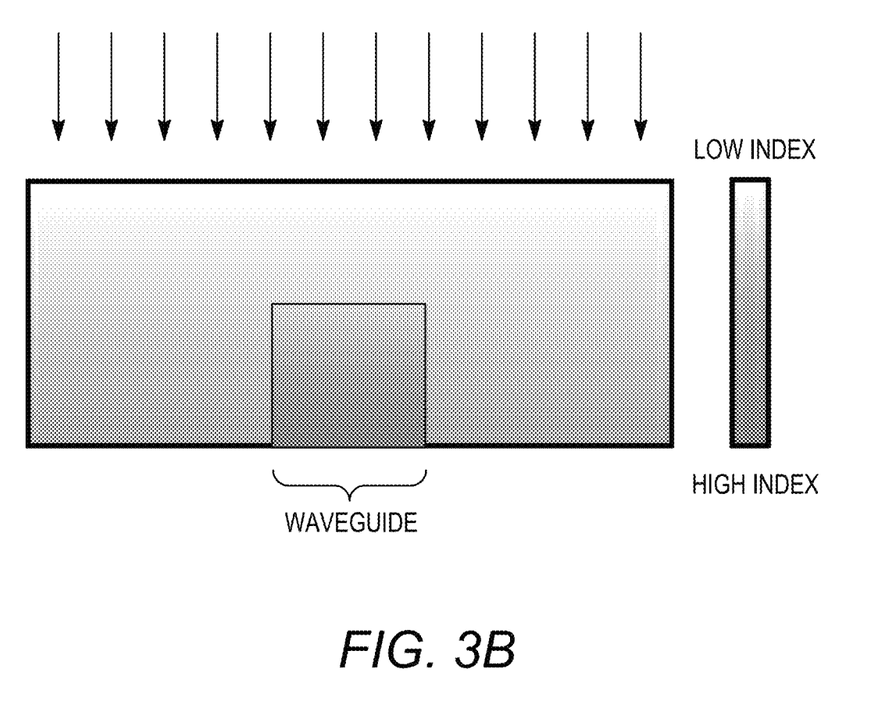
FIG. 3(b) illustrates that the refractive index through the polymer film increases with increasing depth.

Because the UV light is attenuated as it passes through the polymer film, during each of the two exposures the intensity of the UV light as a function of depth into the polymer decreases from top to bottom. This is shown in FIG. 3(a), which illustrates the relationship between the intensity of the UV light and the distance or depth into the polymer film and the relationship between the refractive index and the depth into the polymer polymer film. As a consequence of this attenuation the UV light creates a refractive index profile that increases with increasing depth into the polymer film. This is illustrated in FIG. 3(b), which shows that the refractive index through the polymer film increases with increasing depth.

The total radiation dosage that is used during the initial exposure that forms the side cladding and defines the waveguide core is sufficiently great to fully cure the polymer material through its entire depth from top to bottom. The total dosage used during the second (flood) exposure that forms the upper cladding and reduces the dimensions of the waveguide core will be less than the total radiation dosage that is used during the initial exposure. That is, the total dosage used in the second exposure is no greater than that needed to only cure an uppermost portion of the polymer. The actual dosages that are used during each of the two exposures will depend on a number of factors, including the polymer material employed, the thickness of the polymer layer and the waveguide dimensions that are desired. These dosages may be determined empirically on a case by case basis or by using a pre-determined dose vs. refractive index curve.

Figure 4:
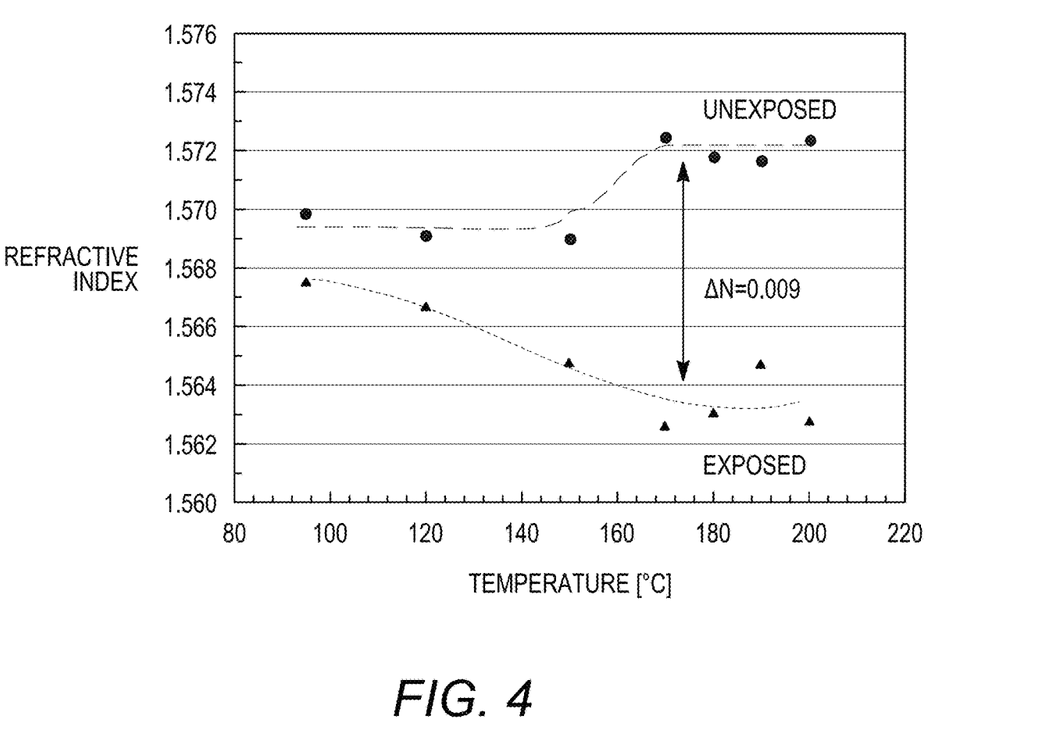
FIG. 4 shows the change in refractive index of a dry film polymer manufactured by Tokyo Ohka Kogyo America Inc (TOKA) when exposed to UV light as a function of baking temperature.
Figure 5A:
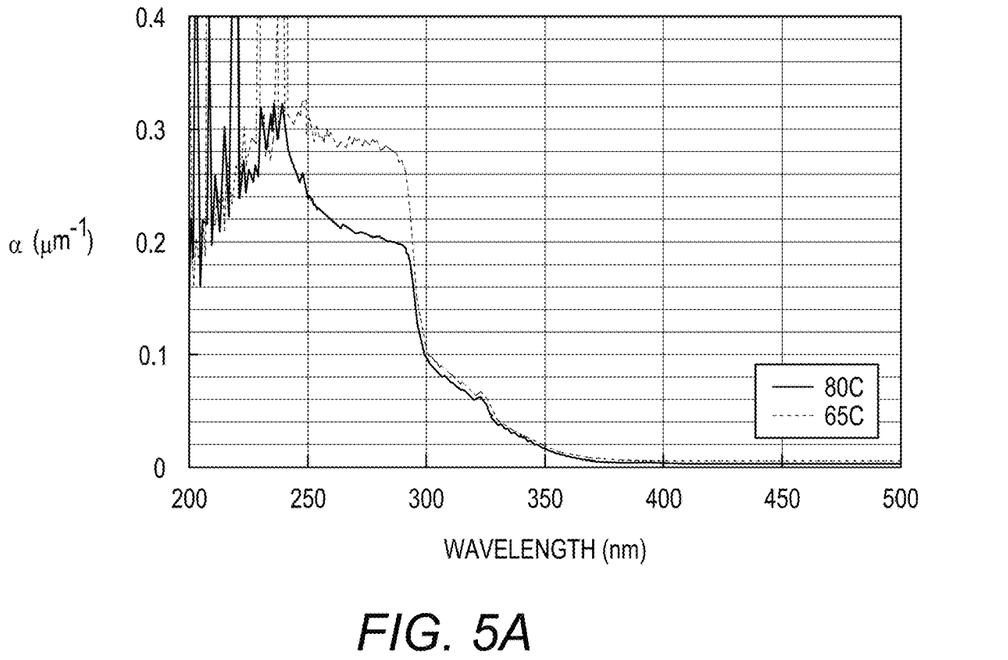
FIGS. 5a and 5b show the absorption spectrum of the dry polymer film of FIG. 4 with pre-exposure baking temperatures of 65° C. and 80° C., respectively.
Figure 5B:
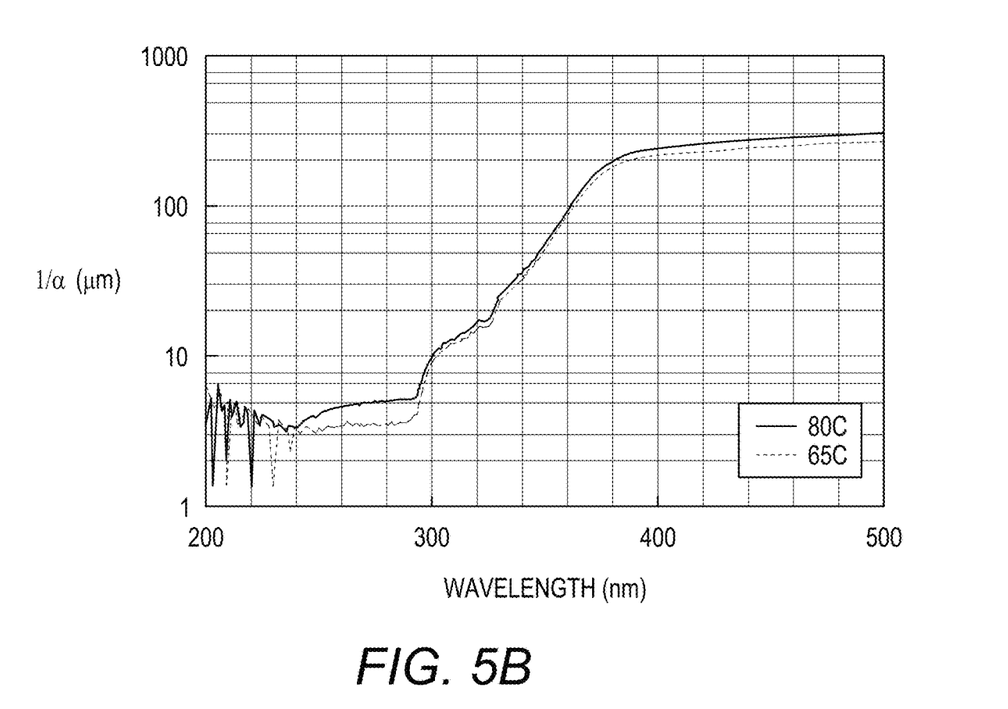

In one embodiment, a dry film polymer manufactured by Tokyo Ohka Kogyo America Inc (TOKA), can be used as the waveguide material. The material is available commercially in bulk roll form with a nominal thickness of 14 microns or greater. Exposure of this material to UV light and baking leads to a change in the refractive index as shown in FIG. 4. The absorption spectrum of the dry polymer film is shown in FIGS. 5a and 5b with pre-exposure baking temperatures of 65° C. and 80° C., respectively The exposure wavelength should be close to the wavelength where the absorption is high while also allowing for substantial penetration into the depth of the film. In this case, high absorption wavelengths are observed to be at a wavelength less than 300 nm.

Figure 6:
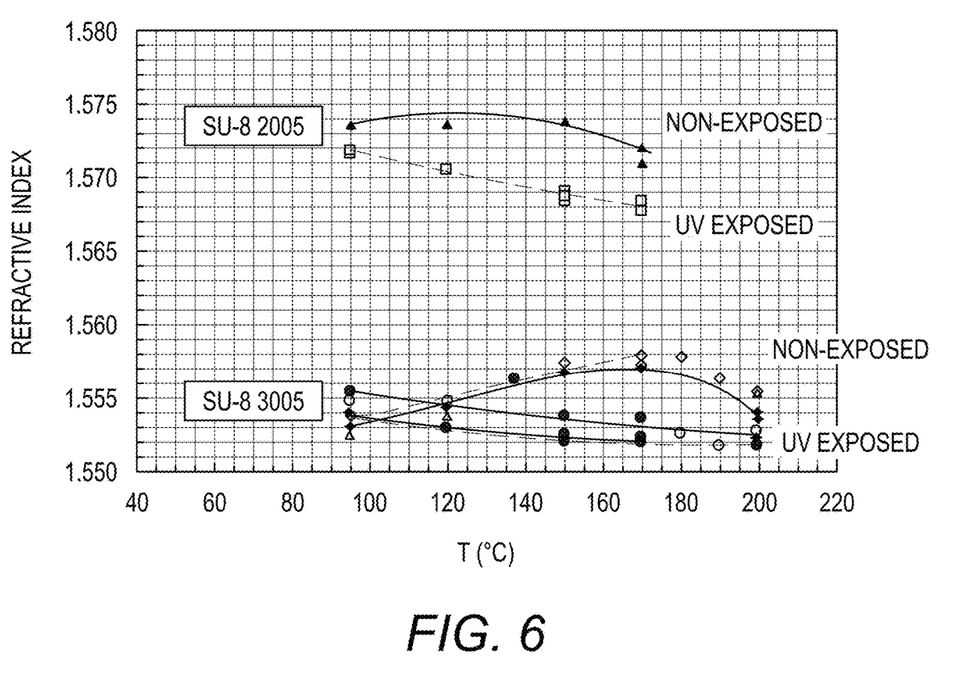
FIG. 6 shows the change in refractive index of dry film polymers made of SU-8 resist when exposed to UV light as a function of baking temperature.

In another embodiment, a dry film polymer made from one or more different formulations of SU-8 resist can be used as the waveguide material. For instance, as shown in FIG. 6, the refractive index of SU-8 2005 is clearly reduced by UV light exposure and a subsequent baking.

In general, any polymer material with the following properties can be used as the waveguide material: (1) the material can be made into a stable dry uniform film, (2) the material has a low optical loss at the operating wavelength of the waveguide, (3) the refractive index of the material is reduced by exposure of UV light and baking and (4) the profile of the refractive index can be defined with a sufficiently high resolution, e.g., approximately the wavelength of the operating waveguide.

Figure 7:
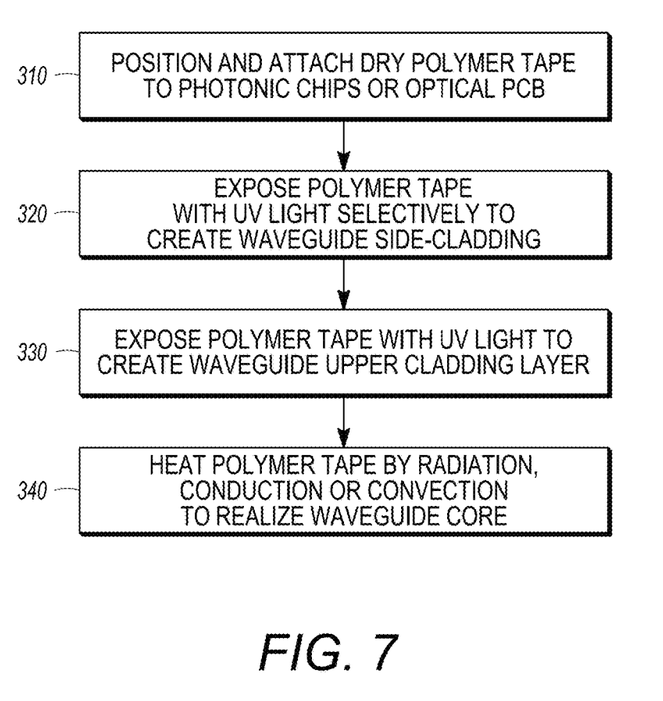
FIG. 7 is flowchart summarizing one embodiment of the waveguide fabrication process in which a polymer tape is employed to form a waveguide that is to serve as an interconnect between two photonic chips or a chip and an optical printed circuit board (OPCB).

FIG. 7 is flowchart summarizing one embodiment of the waveguide fabrication process in which a polymer tape is employed to form a waveguide that is to serve as an interconnect between two photonic chips or a chip and an optical printed circuit board (OPCB).

First, in step 310 the polymer tape is positioned and attached at each end to one of the chips or a chip and the OPCB. Then, in step 320, the polymer tape is patterned by exposing it to a first dosage of radiation to define the waveguide core and side cladding. The polymer tape is then exposed to a second dosage of radiation in a flood exposure step (step 330) to define the upper cladding layer. The second dosage of radiation is less than the first dosage of radiation. Finally, in step 340, the polymer tape is heated by any suitable means such as radiation, conduction or convection. A more detailed example of an embodiment that employs a polymer tape will be presented below.

In one alternative embodiment, the dry film polymer may comprise multiple layers of different polymer materials that have different refractive indices. For instance, one layer may have a lower refractive index and serve as the cladding layer while another layer may have a higher refractive index and serve as the waveguiding core layer. If the waveguide is to be single mode, the thickness of the waveguiding layer generally needs to be about 1 to 8 microns for an operating wavelength of 1.3 to 1.5 microns, for typical refractive index contrasts achieved.

Figure 8:
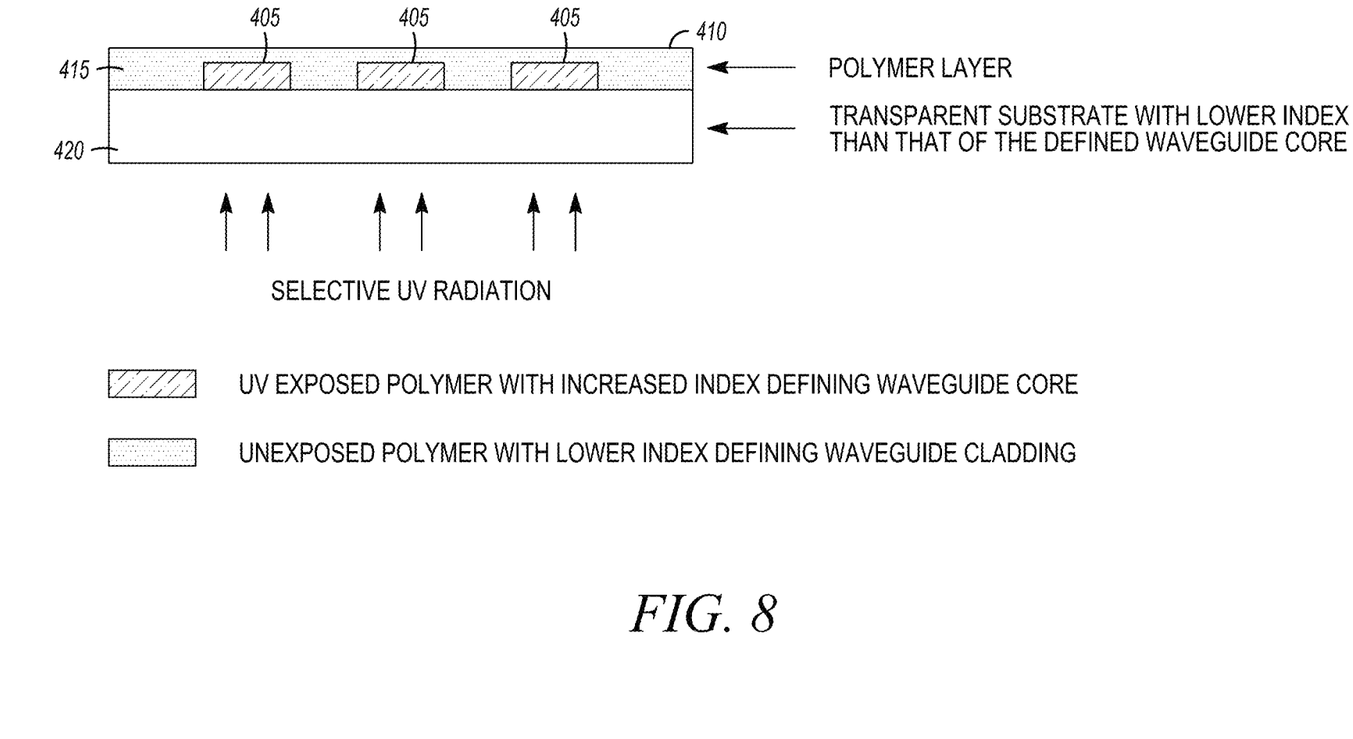
FIG. 8 illustrates the fabrication of a structure in which waveguide cores have been patterned in a polymer layer located on a transparent substrate having a refractive index lower than that of the waveguide cores.

The examples of the polymer waveguide fabrication process described above employ a polymer material in which exposure to radiation reduces the refractive index. In alternative embodiments a polymer material may be used in which exposure to radiation increases the refractive index. In this case, however, the patterning would need to be performed so that the first exposure forms the waveguide core by increasing the refractive index. In addition, the second (flood) exposure would need to be performed from below, through the substrate, and hence requires a substrate that is transparent at the wavelength that is used to increase the refractive index. FIG. 8 shows a structure in which waveguide cores 405 have been patterned in a polymer layer 410 located on a transparent substrate 420 that has a refractive index lower than that of the waveguide cores 405 that have been defined. As shown, a flood exposure step is then performed through the substrate 420 to define the waveguide cladding 415.

In one embodiment the first high-dose exposure that is used to form the waveguide cores 405 need not penetrate the entire thickness of the polymer layer 410. As a consequence, after baking, the waveguide cores 410, as well as the side and upper cladding, may be formed simultaneously. Accordingly, the second flood exposure step need not be employed. However, an optional second flood exposure step (having a dosage less than the first high-dose exposure) may still be employed to reduce the refractive index difference between the cores 405 and cladding.

In addition to the illustrative polymer materials mentioned above, other polymer materials that exhibit a change of refractive indices by UV radiation and thermal processing include, without limitation, ZPU12/ZPU13, Lightlink, Epo-Core/EpoClad, SEO 250, MAPTMS/ZPO, polymethylmethacrylate, polycarbonate, Cytop, and RHTil.

Figure 9:
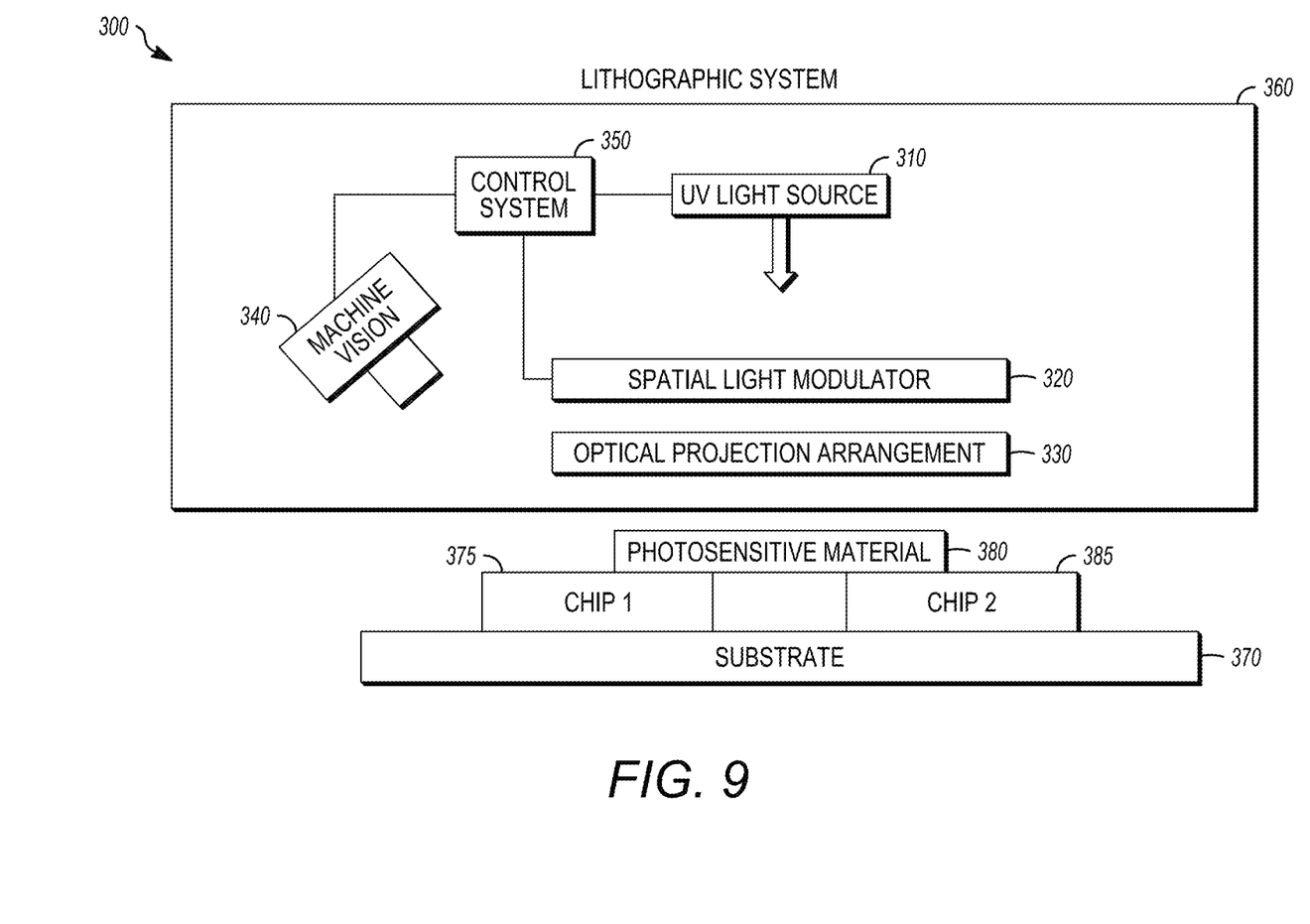
FIG. 9 is a block diagram view of an illustrative maskless lithography system that may be employed to pattern the polymer waveguides in accordance with the techniques described herein

FIG. 9 is a block diagram view of an illustrative maskless lithography system 300 that may be employed to pattern the polymer waveguides in accordance with the techniques described herein. The maskless lithography system 300 includes a light source 310 such as a mercury lamp source or ultraviolet laser. The light from the light source 310 is directed to a programmable SLM 320. The programmable SLM 320 is configured to receive image pattern data, also referred to as mask layout data, representative of a desirable lithographic pattern, and direct light representative of the image to an optical projection arrangement 330. The light from the optical projection arrangement 330 then falls onto a photosensitive material 380 that is to define an optical interconnect between chips 375 and 385, which are located on a substrate 370. The optical projection arrangement 330 reduces the dimensions of the image received from the programmable SLM 320 and projects the reduced image onto the photosensitive surface of the substrate.

The lithography system 300 also includes a control system 350 and a vision system 340 to measure the locations on the substrate 370 at which the interconnections are to be made. The vision system 340 may be, by way of illustration, a machine vision camera, a microscope with scanning and stitching capabilities, an x-ray inspection system, or a scanning electron microscope. The control system 350 includes a computer processor, a memory, and a user interface configured to enable a user to input data for instructing the system 300 to produce a printed pattern on or in the photosensitive material 380 in which the optical interconnect structure is to be formed. The entire lithographic system 300 is mounted on a scanning stage or robotic arm 360 whose movement over the substrate is determined by the control system 350 using information obtained from the vision system 350.

Figure 10:
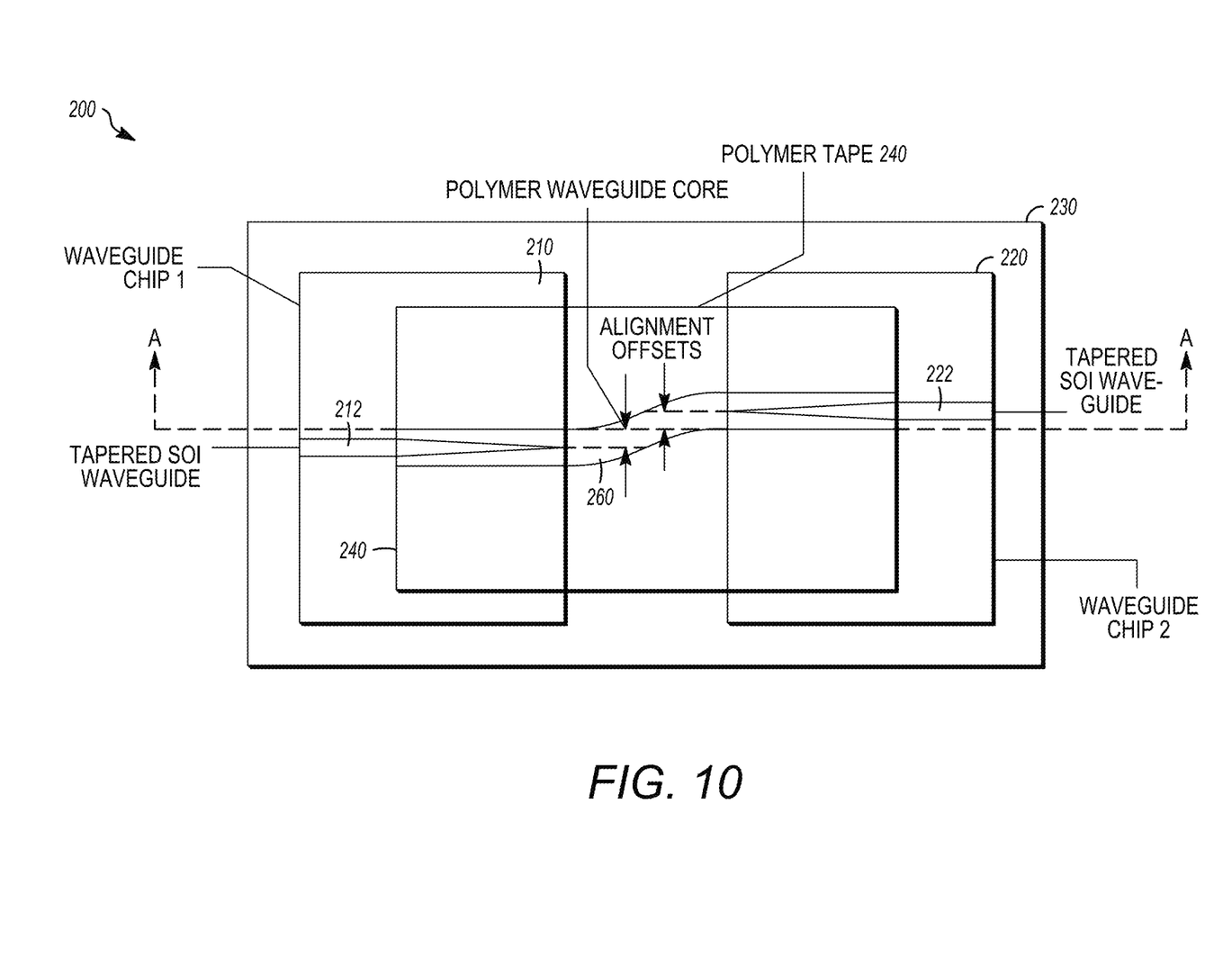
FIGS. 10 and 11 show a simplified planar view and side-view, respectively of a PIC that includes two photonic chips 210 and 220 that are interconnected with a polymer waveguide fabricated in accordance with the techniques described herein.
Figure 11:
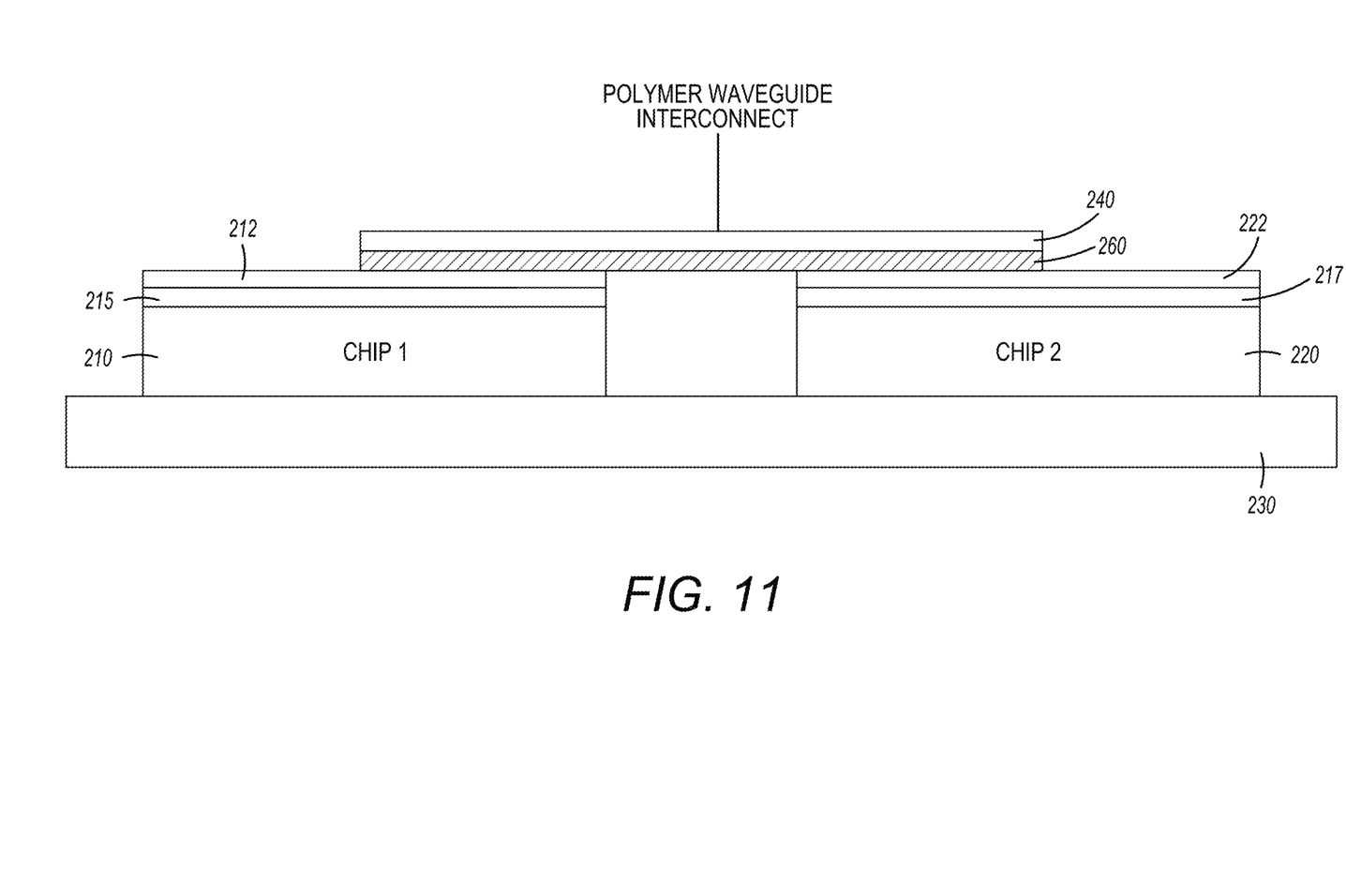

A more detailed example of the waveguide fabrication process summarized in the flowchart of FIG. 7 will now be presented with reference to FIGS. 10 and 11. As in FIG. 7, in this example the waveguide is formed in a polymer tape and is to serve as an optical interconnect between two photonic chips.

FIGS. 10 and 11 show a simplified plan view and side-view, respectively of a PIC 200 that includes two photonic chips 210 and 220 that are located on a substrate 230. The chips 210 and 220 include respective waveguides 212 and 222 that are to be interconnected with one another. In one embodiment, the waveguides 212 and 222 are silicon-on-insulator (SOI) waveguides and may be formed, for example, on respective oxide layers 215 and 217 that overlie chips 210 and 220, respectively. The waveguides 212 and 222 include inverse tapers in which the waveguide cross-section is decreased to a size that is typically smaller than a maximum waveguide cross-section such that the waveguide remains single mode, in order to also expand the mode profile. In some embodiments the inverse tapers are adiabatically tapered to allow optical energy to be adiabatically coupled with minimal loss. The waveguides 212 and 222 are shown as being misaligned and offset from one another. This misalignment may result from less than optimal placement of the chips 210 and 220 on the substrate 230.

A polymer tape 240 is first positioned on and attached at each end to the chips 210 and 220. Then, the vision system 340 in maskless lithography system 300 of FIG. 9 is used to precisely measure the locations of the starting and ending points of the polymer waveguide that is to be formed in the polymer tape 240. These measurements are used to generate mask layout data that is used pattern the polymer tape 240 by exposing it to the first dosage of radiation to define the waveguide core and side cladding. The polymer tape 240 is then exposed to the second, smaller, dosage of radiation in a flood exposure step to define the upper cladding layer. The polymer tape 240 is then heated to cure the polymer and complete the formation of the optical waveguide interconnect 260 in the polymer tape 240.

While exemplary embodiments and particular applications of this invention have been shown and described, it is apparent that many other modifications and applications of this invention are possible without departing from the inventive concepts herein disclosed.

The invention claimed is:

1. A method of forming a waveguide in a polymer film disposed on a substrate, comprising:
   selectively exposing a plurality of regions on a polymer film to a first dosage of radiation, the plurality of regions defining side cladding regions, the polymer film being formed from a material having a refractive index that decreases by exposure to the radiation and subsequent heating;
   selectively exposing to a second dosage of radiation at least one region of the polymer film that was not previously exposed to the radiation to define an upper cladding region over the side cladding regions and over at least one core region located between adjacent ones of the side cladding regions, the second dosage or radiation being less than the first dosage of radiation; and
   subsequently heating the polymer film to cause a refractive index of the exposed regions of the polymer film to decrease and to cause a refractive index of unexposed regions of the polymer film to increase so that the refractive index in the unexposed regions is greater than in the exposed regions.

2. The method of claim 1, wherein selectively exposing at least one region of the polymer film to the second dosage of radiation includes uniformly exposing all of a surface of the polymer film to the second dosage of radiation.

3. The method of claim 1, wherein selectively exposing the plurality of regions on the polymer film to the first dosage of radiation is performed using a mask.

4. The method of claim 1, wherein selectively exposing the plurality of regions on the polymer film to the first dosage of radiation is performed using a maskless lithography process.

5. The method of claim 1, wherein the polymer film comprises a plurality of layers of different polymer materials having different refractive indexes.

6. The method of claim 1, wherein selectively exposing at least one region of the polymer film to the second dosage of radiation defines at least one waveguide core that operates as a single mode waveguide at a specified optical wavelength.

7. The method of claim 1, wherein the radiation is UV radiation.

8. The method of claim 1, wherein the polymer film is a polymer tape that includes an adhesion layer and further comprising applying the polymer tape onto the substrate so that the polymer tape is secured to the substrate by the adhesion layer.

9. The method of claim 8, further comprising applying at least one end of the polymer tape to a first photonic chip located on the substrate.

10. The method of claim 9, further comprising applying at least a second end of the polymer tape to a second photonic chip located on the substrate.

\* \* \* \* \*